(12) United States Patent
Goff

(10) Patent No.: US 6,647,311 B1
(45) Date of Patent: Nov. 11, 2003

(54) COUPLER ARRAY TO MEASURE CONDUCTOR LAYER MISALIGNMENT

(75) Inventor: Miles E. Goff, Carlisle, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/442,587

(22) Filed: Nov. 18, 1999

(51) Int. Cl.[7] .................. G06F 19/00; H01L 23/544
(52) U.S. Cl. .................. 700/125; 700/57; 257/797; 438/975
(58) Field of Search .................. 700/57.58, 110, 700/121, 124, 125; 257/48, 797; 324/500, 755–758, 765–769; 438/10, 11, 14, 17, 18, 975

(56) References Cited

U.S. PATENT DOCUMENTS

| | | | | |
|---|---|---|---|---|
| 4,376,921 A | * | 3/1983 | Dickens et al. | 333/116 |
| 4,386,459 A | * | 6/1983 | Boulin | 438/11 |
| 4,566,193 A | * | 1/1986 | Hackleman et al. | 33/1 D |
| 4,647,850 A | * | 3/1987 | Henderson et al. | 33/533 |
| 4,654,581 A | * | 3/1987 | Neukermans et al. | 324/725 |
| 5,351,001 A | * | 9/1994 | Kornrumpf et al. | 324/158.1 |
| 5,898,228 A | * | 4/1999 | Sugasawara | 257/797 |
| 6,143,621 A | * | 11/2000 | Tzeng et al. | 438/401 |
| 6,221,681 B1 | * | 4/2001 | Sugasawara | 438/14 |
| 6,232,559 B1 | * | 5/2001 | Janecek | 174/255 |
| 6,236,222 B1 | * | 5/2001 | Sur, Jr. et al. | 324/758 |
| 6,242,757 B1 | * | 6/2001 | Tzeng et al. | 257/48 |
| 6,305,095 B1 | * | 10/2001 | Look et al. | 33/645 |
| 6,353,327 B2 | * | 3/2002 | Nishikawa | 324/758 |
| 2001/0030058 A1 | * | 10/2001 | Janecek | 174/250 |

FOREIGN PATENT DOCUMENTS

| | | | |
|---|---|---|---|
| EP | 2148515 A | * | 5/1985 |
| JP | 09139469 A | * | 5/1997 |
| JP | 09260453 A | * | 10/1997 |

* cited by examiner

*Primary Examiner*—Maria N. Von Buhr
(74) *Attorney, Agent, or Firm*—Foley Hoag LLP

(57) ABSTRACT

Systems and methods are presented for employing arrays of coupling strips to measure misalignment of layers of multilayer devices as a function of directional coupling between pairs of strips. Each array is capable of detecting misalignment only in the direction perpendicular to the axes of the coupling strips, although multiple arrays may be employed for measuring misalignment in more than one direction. Such arrays are easily manufactured onto existing multilayer devices, and may be excised from such devices after misalignment has been measured.

15 Claims, 6 Drawing Sheets

COUPLER ARRAY TO MEASURE CONDUCTOR LAYER MISALIGNMENT

BACKGROUND OF THE INVENTION

Modern commercial electronic products often require multilayer printed circuit boards to achieve a high degree of functionality in a small volume. In recent years, the economic demands upon packaging technology to make things better, cheaper, and faster has led to the development of multilayer ceramic packages for RF integrated circuit (RFIC) semiconductor chips. These advanced devices include power distribution runs, built in resistors and capacitors, and perhaps even simple microwave components such as couplers and power combiners. Modern military phased array antenna systems require multilayer microwave corporate feed assemblies to achieve a high degree of functionality, especially at high frequencies where the array element spacing is small. These boards and packages are assembled layer by layer, and precise alignment between the separately formed layers is necessary to ensure the appropriate electrical connections are made between the various layers. When such multilayered devices are manufactured, though, it is difficult to determine that the multiple layers have been properly aligned for optimal function.

Because such misalignment occurs between buried conductor layers which are not visible to the eye, a number of partial solutions have been developed. X-rays can be used to probe the interior of the device, but such methods offer limited resolution, a waiting period while films develop, and potential health hazards associated with the use of X-rays. Another solution has been to cut apart the finished assembly to view the cross section. Obviously, this test destroys the device in question, which can be costly, and similarly presents a delay time. Application of this test to ceramic-based devices may prove even more difficult due to the nature of the materials involved. Furthermore, such a destructive test cannot be used to evaluate the quality of device prior to use or sale.

A quick, inexpensive, and accurate method for detecting layer misalignment in multilayer devices is needed. A quick, inexpensive, accurate, and safe method for detecting layer misalignment in a multilayer device that does not render the device inoperable is also needed.

SUMMARY OF THE INVENTION

The invention pertains to a coupler array that is manufactured as a part of a multilayer chip which can be used to quickly and easily detect misalignment of layers of the multilayer board. In one aspect, the invention provides a pair of coupling strips for detecting layer misalignment in a multilayer device, comprising a lower coupling strip formed on a first layer of said multilayer device, and an upper coupling strip formed on a second layer of said multilayer device disposed parallel to and offset from the lower coupling strip by a predetermined amount, such that measuring the amount of coupling in the pair of coupling strips is useful for detection of layer misalignment in the device.

In one embodiment, the invention provides a coupler array for detecting layer misalignment in a multilayer device, comprising at least two pairs of coupling strips as described above disposed in parallel, wherein the offset amounts of at least two pairs of coupling strips are different, such that measuring the amount of coupling in different pairs of coupling strips is useful for detection of layer misalignment in the device. In one embodiment, at least one pair of coupling strips has an offset amount of zero. In another embodiment, the offset amounts of at least two pairs of coupling strips differ by a predetermined amount. In another embodiment, the array may include at least two additional pairs of coupling strips disposed in parallel, such that the offset amounts of at least two additional pairs of coupling strips are different, and the additional pairs of coupling strips are not parallel to the first pairs of coupling strips. In certain related embodiments, measuring the amount of coupling in the different pairs of coupling strips is useful for determining layer misalignment in two dimensions.

In yet another embodiment, an array of coupling strips includes at least two additional pairs of coupling strips disposed in parallel, wherein the offset amounts of at least two second pairs of coupling strips differ, and wherein the upper coupling strips of said second pairs of coupling strips are disposed on a third layer of said multilayer device, and the lower coupling strips of said second pairs of coupling strips are disposed on the second layer of the multilayer device.

Another aspect of the present invention provides method for manufacturing a pair of coupling strips for detecting layer misalignment in a multilayer device, by providing a first layer of the multilayer device, forming a lower coupling strip on the first layer of the multilayer device, disposing a second layer of the multilayer device above said lower coupling strip, and forming an upper coupling strip on the second layer of said multilayer device, the upper coupling strip being disposed parallel to the lower coupling strip and offset from the lower coupling strip by an offset amount. In a further embodiment, this method is used to dispose at least two pairs of coupling strips in parallel in different offset amounts. In one embodiment, at least one pair of coupling strips has an offset amount of zero. In another embodiment, at least two pairs of coupling strips have predetermined offset amounts.

In yet another aspect, the invention provides a method for detecting misalignment of layers in a multilayer device by providing a device having at least two first reference probes disposed parallel to each other and spaced by a predetermined amount and a second layer including at least two second reference probes disposed parallel to each other, spaced by a different predetermined amount, and disposed above the first reference probes, Misalignment may then be detected by measuring an amount of coupling between at least two first reference probes and corresponding second reference probes, comparing the amounts of coupling measured for different reference probes, and determining the misalignment of the first layer with the second layer.

In a related embodiment, the invention provides a method for detecting misalignment of layers in a multilayer device, comprising providing a device including a coupler array as described above, measuring amounts of coupling in at least two pairs of coupling strips, comparing the amounts of coupling measured in different pairs of coupling strips, and determining the relative alignment of the first layer with the second layer.

In yet another aspect, the invention provides a system for measuring misalignment of layers in a multilayer device. The system includes a coupler array of claim as described above, a microwave generator, and a microwave receiver to measure the amount of coupling in a pair of coupling strips.

In another aspect, the invention provides a method for measuring misalignment of layers in a multilayer device, by providing a coupler array as described above, providing a microwave generator and receiver, connecting the generator and receiver to a first pair of coupling strips, measuring the amount of coupling in the first pair of coupling strips, coupling the generator to a second pair of coupling strips, measuring the amount of coupling in the second pair of coupling strips, comparing the amount of coupling in the first pair of coupling strips to the amount of coupling in the second pair of coupling strips, and determining the misalignment of layers in the multilayer device.

BRIEF SUMMARY OF THE FIGURES

The following figures depict certain illustrative embodiments of the invention in which like reference numerals refer to like elements. These depicted embodiments are to be understood as illustrative of the invention and not as limiting in any way.

DETAILED DESCRIPTION OF THE ILLUSTRATED EMBODIMENTS

The description below pertains to several possible embodiments of the invention. Although many variations of this invention may be envisioned by one skilled in the art, such variations and improvements are intended to fall within the compass of this disclosure. The scope of the invention is not intended to be limited in any way by the disclosure below.

The measurement of coupling between parallel conductive strips disposed on different layers of a multilayer device can be used to infer the alignment of such strips. The magnitude of directional coupling is primarily affected only by displacement perpendicular to the axis of such strips; displacement along the axis of the strips will result in a change of the frequency of the coupling without substantially affecting the amount of coupling. Standard, commercially available equipment can be employed to measure coupling between two such strips in accord with the systems and methods described herein, for instance, a Hewlett Packard Model 8510B Vector Network Analyzer or equivalent and a Cascade Microtech Model 42 Probe Station or equivalent equipped with suitable microwave probes.

The coupler arrays described herein are designed to be incorporated into a multilayer device, used to measure the misalignment between conductor layers in the multilayer device, and then, optionally, separated from the device. In this manner, the final multilayer device produced may be identical to currently produced devices. Representative multilayer devices include, but are not limited to, devices comprising copper conductors and epoxy fiberglass board dielectric laminates, and thick film metal conductors and ceramic dielectric insulating laminates. The incorporation of a coupler array as described herein allows for a quick, inexpensive, and accurate quality assay to be performed on a multilayer device.

Figure 1:
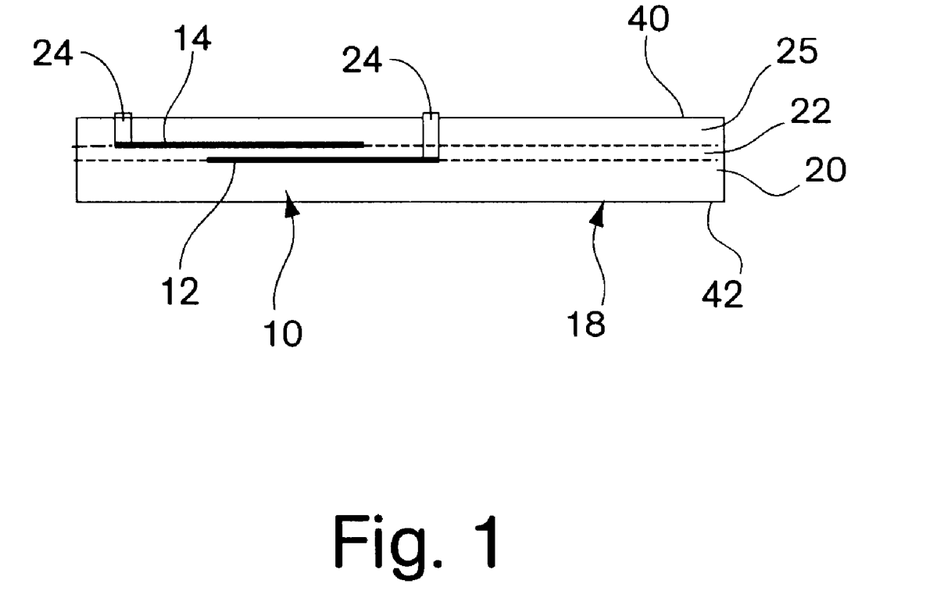
FIG. 1 depicts a side cut away view of a multilayer device including a coupler array.

One embodiment of the invention is depicted in FIG. 1. A coupler array 10 has a lower coupling strip 12 placed on one layer 20 of a multilayer device 18 and an upper coupling strip 14 placed on a second layer 22 of the multilayer device 18. A top layer 25 is placed thereon. The coupling strips 12 and 14 are disposed parallel to each other. The term coupling strip, as used herein, will be understood to encompass any structure which is coupled to a second structure in a manner that is dependent upon the relative positions of both structures. A coupling strip may include metal, such as copper, aluminum, gold, and other metals and alloys, or any other conductive material, including resistive materials such as carbon paste. Each coupling strip is placed in a particular location relative to other features of the layer which incorporates that strip, allowing its use as a reference probe. A reference probe, as the term is used herein, will be understood to encompass any structure which can be used to relate the location of one object to another. Each coupling strip is coupled to a connection via 24. A connection via, as the term is used herein, will be understood to encompass any device which permits the connection of a coupling strip to a measuring device. Multilayer device 18 may further comprise a bottom metal layer 42 and a top metal layer 40.

Figure 2:
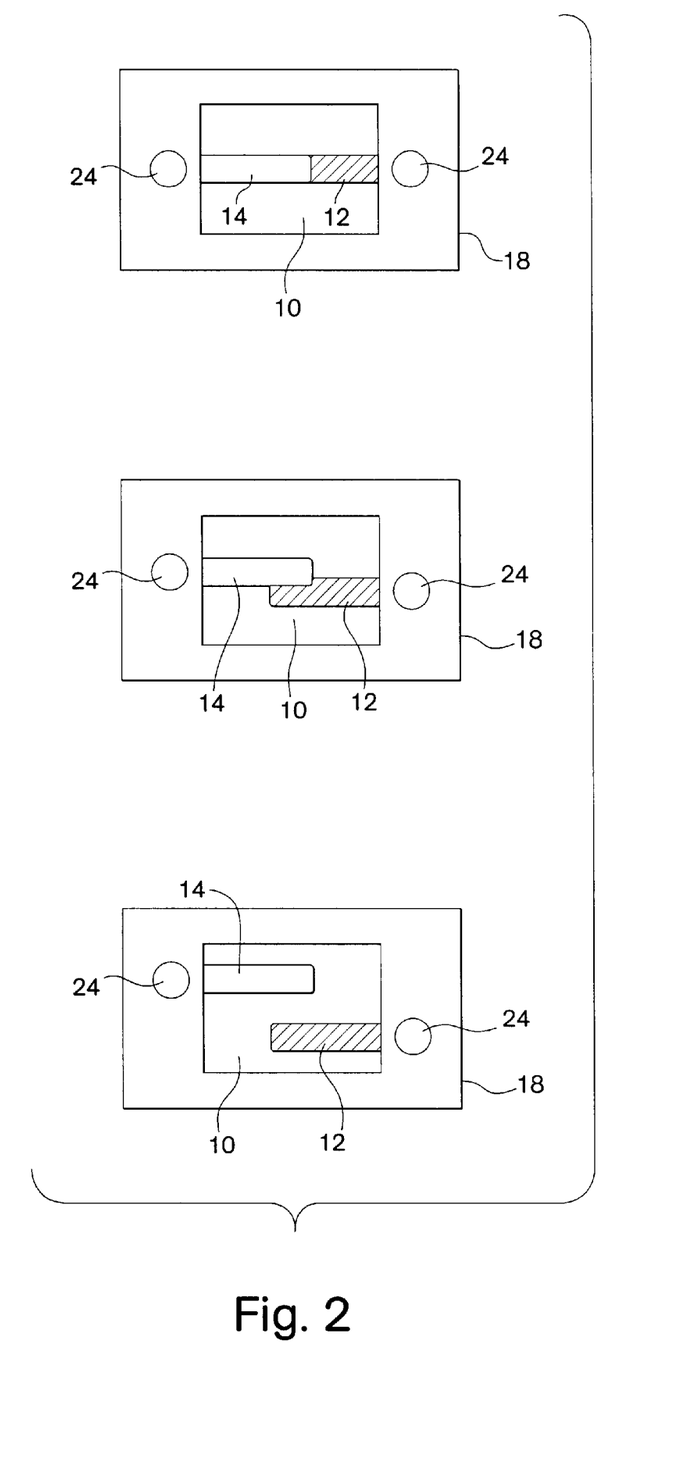
FIG. 2 depicts a top view of a multilayer device including a coupler array with one pair of coupling strips, showing three conditions of misalignment.

The coupler array can impart information about the alignment between the two layers having coupling strips disposed thereon by testing the coupling strips to determine the amount of coupling between each pair of strips. The amount of coupling will be proportional to the amount of overlap of the two coupling strips 12 and 14 in the direction perpendicular to the axes of the coupling strips (FIG. 2). In the coupler depicted at the top of FIG. 2, the two coupling strips 12 and 14 are aligned for maximum overlap, allowing for maximum coupling. In the coupler shown at the center of FIG. 2, the two coupling strips are misaligned, and the amount of coupling between them will be reduced relative to the coupler shown at the top of FIG. 2. In the coupler presented at the bottom of FIG. 2, the coupling strips are very misaligned, and little or no coupling can be achieved. The coupling strips of the present invention may be designed so that a shift in the layers parallel to the axes of the coupling strips does not substantially change the amount of coupling, as would be true for a system which measures capacitance between two conductors. If the maximum amount of coupling for a pair of coupling strips is known, the magnitude of the misalignment, which is proportional to the reduction in coupling, can be determined.

During manufacturing of the multilayer device, the coupling strips are placed in precisely defined locations on each layer relative to other features of that layer. Consequently, misalignment of two reference probes, as indicated by reduced coupling between two coupling strips, corresponds to misalignment of all features between the two layers of which the reference probes are a part. This misalignment, which may impair the function of the other features of the device, can be quickly detected using a coupler array built into the board. The portion of the device bearing the coupler array can be excised from the device after testing.

Figure 3:
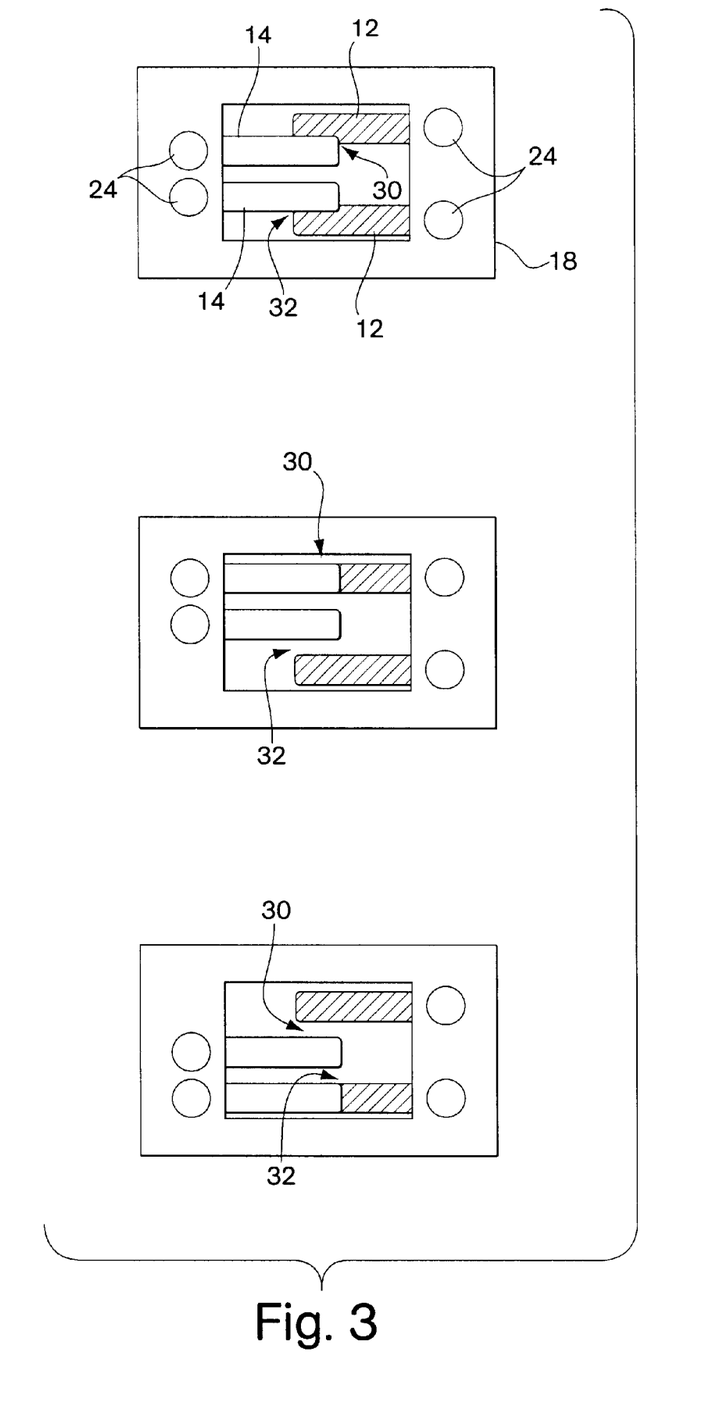
FIG. 3 depicts top view of a multilayer device including a coupler array with two pairs of coupling strips, showing three conditions of misalignment.

A coupler array capable of readily distinguishing between misalignment in one direction and misalignment in the opposite direction requires more than one pair of coupling strips 12 and 14. Such an array is depicted in FIG. 3. In this embodiment of the invention, there are two upper coupling strips 14 and two lower coupling strips 12. The upper coupling strips are parallel and are spaced by a predetermined amount, and the lower coupling strips are parallel and are spaced by a different predetermined amount. As shown, neither the first pair of coupling strips 30 nor the second pair of coupling strips 32 are perfectly aligned when the corresponding layers of the multilayer device 18 are aligned, but other arrangements are possible and are within the scope of the present invention. The coupler array of this embodiment requires only that the two pairs of coupling strips 30 and 32 not have identical overlap in the same direction. Identical overlap is possible in opposite directions, as pictured at the top of FIG. 3.

When the two layers of device 18 are aligned, as depicted at the top of FIG. 3, both pairs of coupling strips 30 and 32 have the same amount of overlap and will have the same amount of coupling. If the lower layer bearing lower coupling strips 12 shifts in one direction, as shown in the center of FIG. 3, the first pair of coupling strips 30 will have increased coupling, while the lower pair of coupling strips 32 will have decreased coupling. If the misalignment is shifted in the opposite direction, as shown at the bottom of FIG. 3, the second pair of coupling strips 32 will have a greater coupling than the first pair of coupling strips 30. Thus, the magnitude of coupling of pairs of coupling strips 30 and 32 differs depending on the direction of misalignment. Misalignment in either of two directions can be specifically detected and the magnitude of misalignment estimated.

Figure 4:
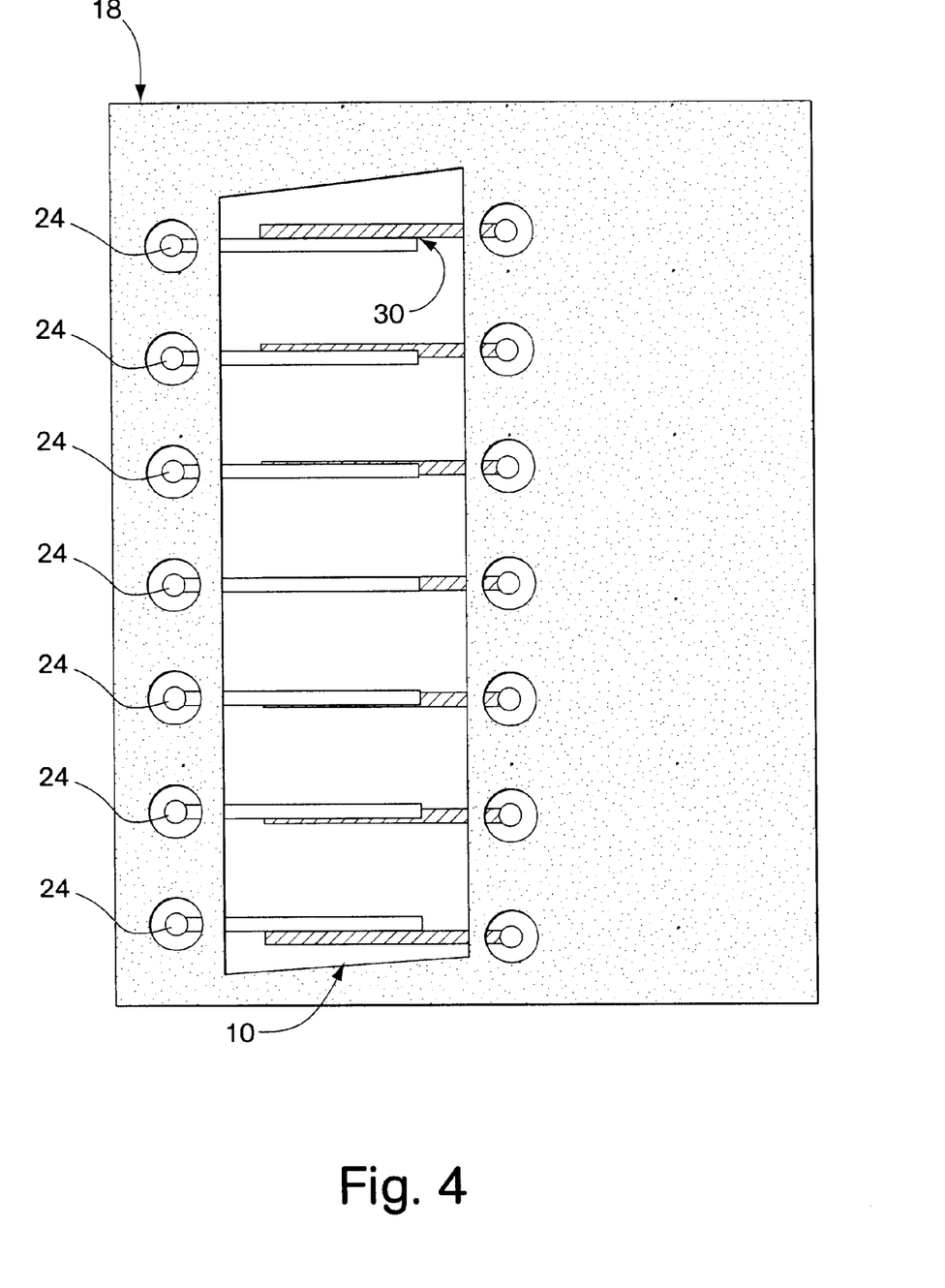
FIG. 4 depicts a top view of a multilayer device including a coupler array with seven pairs of coupling strips.

Coupler arrays having more than two pairs of coupling strips may also be useful in determining misalignment between layers of a multilayer device 18. FIG. 4 depicts a coupler array 10 according to the systems and methods disclosed herein having seven pairs of coupler strips 30. The center pair is perfectly aligned when the two layers of device 18 are perfectly aligned, and the other pairs of coupling strips are each offset by different amounts. In this fashion, the direction and magnitude of misalignment perpendicular to the coupling strips can be readily determined by measuring the coupling of the seven pairs of coupling strips. Although all of the upper coupling strips in the embodiment depicted in FIG. 4 are evenly spaced by a set amount, and all of the lower coupling strips are even spaced by a different set amount, other arrangements are possible. The systems and methods described herein require only that the positions of each of the upper coupling strips 14 relative to other features of the second layer 22 are known, and that the positions of the lower coupling strips 12 relative to other features of the first layer 20 are known.

Figure 5:
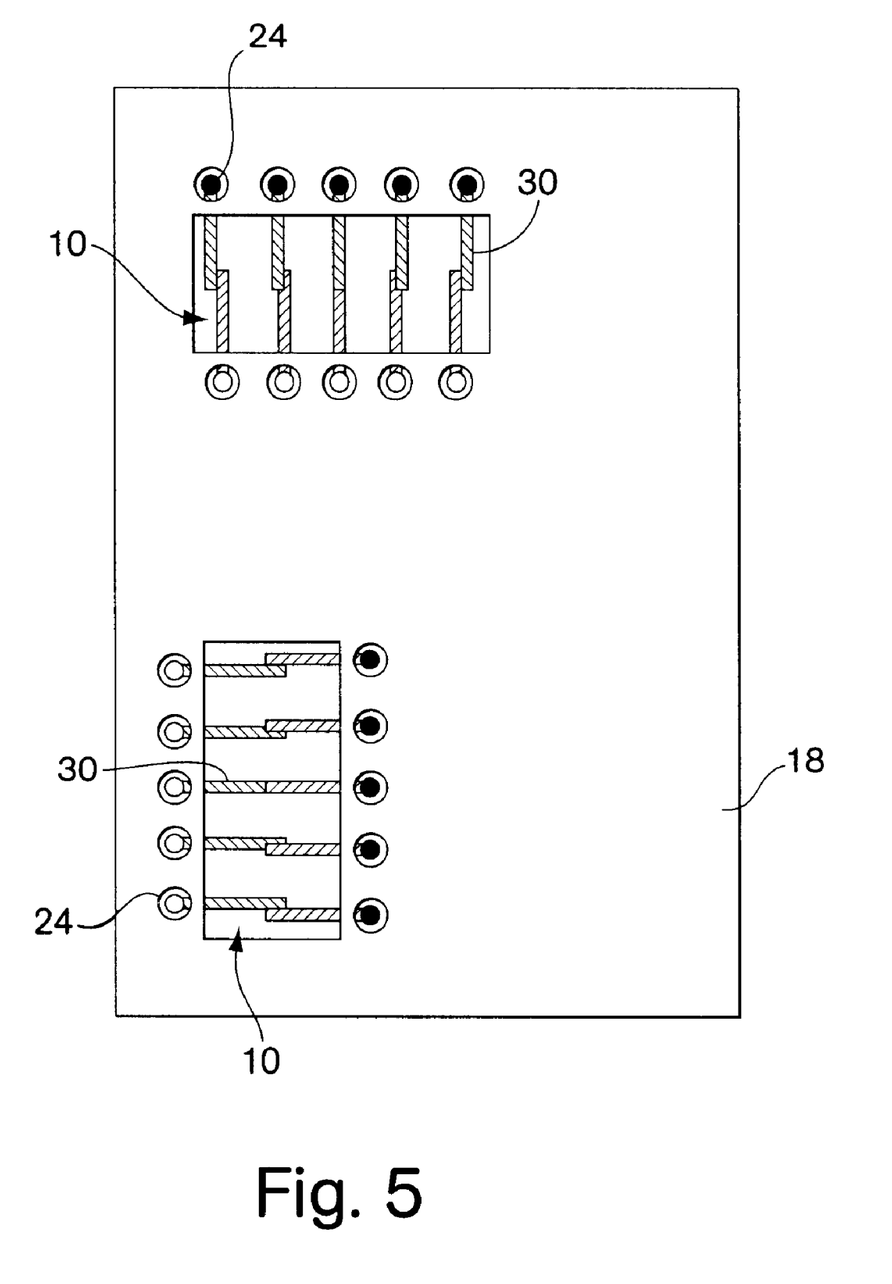
FIG. 5 depicts a top view of a multilayer device having two coupler arrays for detecting misalignment in two dimensions.

A system useful for detecting layer misalignment in two dimensions may have at least two coupler arrays which are disposed transverse to one another. For example, FIG. 5 depicts a multilayer device 18 having two coupler arrays disposed perpendicular to one another. Multilayer devices having two or more coupler arrays which are neither parallel nor perpendicular to one another are also useful for the systems and methods disclosed herein and are held to be within the scope of the invention. Each coupler array has five pairs of coupling strips 30, although embodiments with as few as one pair of coupling strips each coupler array can be used to determine misalignment in two dimensions, and there is no limit to the number of pairs of coupling strips that may be used. One coupler array in this embodiment is used to measure misalignment in one dimension, and the other coupler may be used to measure misalignment in a second dimension perpendicular to the first. From this information, the direction and magnitude of layer misalignment can be determined for two dimensions.

Figure 6:
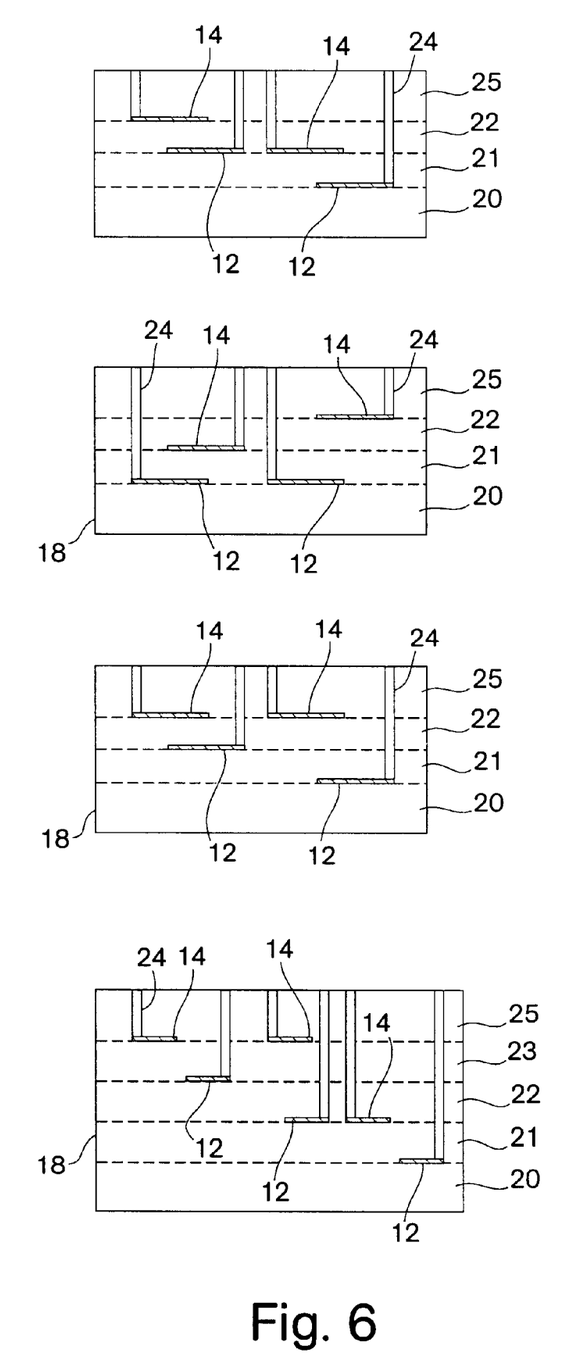
FIG. 6 depicts side cut away views of multilayer devices having microwave coupler arrays for detecting misalignment between pairs of several layers.

FIG. 6 depicts side cutaway views of several arrangements of coupler arrays which may be appropriate for detecting layer misalignment in devices having four or more layers. At the top of FIG. 6, an arrangement is depicted for a device having four layers, in which one or more lower coupling strips 12 are disposed on each of the two layers 20 and 21, and corresponding upper coupling strips 14 are disposed on each of the two layers 21 and 22 above and parallel to the lower coupling strips 12. In this arrangement, displacement between adjacent layers 20 and 21 and adjacent layers 21 and 22 may be directly measured, and any misalignment between layers 20 and 22 may be inferred.

Alternatively, all lower coupling strips 12 may disposed on the layer 20, below and parallel to upper coupling strips 14 disposed on each of the two layers 21 and 22, as depicted in the upper center of FIG. 6. In this arrangement, displacement between layers 20 and 21 and layers 20 and 22 may be directly measured, and displacement between layers 21 and 22 may be inferred.

A third arrangement is presented in the lower center of FIG. 6. In this arrangement, all upper coupling strips 14 are disposed on layer 22, above and parallel to lower coupling strips 12 disposed on each of the two layers 20 and 21. Using this arrangement, displacement between layers 22 and 21 and layers 20 and 22 may be directly measured, and displacement between layers 21 and 20 may be inferred.

For devices having more than four layers, many permutations of arrangements may be used to detect misalignment of the various layers. For example, the lowest diagram on FIG. 6 shows a cutaway side view of a device having five layers. At least one upper coupling strip 14 is disposed on each of layers 21, 22, and 23, above and parallel to lower coupling strips 12 disposed on layers 20, 21, and 22. In this arrangement, misalignment may be directly detected between layers 20 and 21, layers 21 and 22, and layers 22 and 23. Misalignment between any other pair of layers may be thereby inferred.

A multilayer device comprising a copper/epoxy fiberglass board laminate having three layers as shown in FIG. 1 may be manufactured by the following technique. Starting with a epoxy board 20 with copper on both sides, having properties well known in the art as being desirable for a particular design, standard photoetching techniques may be used to pattern the lower coupling strip 12 on the top of this board. The bottom metal layer 42 may optionally be patterned at this time as required by the final design. Another copper clad epoxy fiberglass board 22 may then be perforated where connection vias 24 are required, and the vias may be copper plated using through-hole plating techniques known to those of skill in the art. After treatment of the adjoining layers according to methods well known in the art, this middle board 22 may be laminated to the lower board 20 using a thin layer of adhesive material. Appropriate masking techniques known to one of skill in the art may be employed to ensure the adhesive layer will not be present where electrical connection between the connection vias 24 through the middle board 22 and the lower coupling strip 12 on the bottom board 20 is required, and an additional plating step may be employed to ensure electrical connection of the vias. The upper coupling strip may then be patterned on the top of the middle board. The top layer 25 may be prepared in a similar fashion to middle layer 22, and lamination procedures as described above may be employed to adhere the top layer 25 to the growing construct, and subsequent connection via plating and filling procedures may be used to ensure continuity of the connection vias. After patterning the top metal layer 40 of the laminated composite to open up holes suitable for making electrical contact to the connection vias, the board may optionally then be marked by silk screening identification markings on the top.

It will be obvious to one of skill in the art that replacement of one of the metal layers with a non-metal conductive layer, including a resistive material such as carbon paste, will be suitable for the systems and methods disclosed herein. Although a change of material will change the magnitude of coupling, the methods described herein rely on the difference in coupling between two or more pairs of coupling strips, and are thus applicable to systems having pairs of unlike strips.

The manufacture of a buried coupler array using multilayer ceramic technology may begin by drawing an array of coupling strips on alternate layers as has been described above. These drawings may be created using one of the many computer-aided drawing programs available today, such as AutoCad (a product of Autodesk, Inc.), and further processed to form silkscreen masks using standard photolithography techniques. These masks permit the application of conductor pastes in certain areas of a subassembly while preventing the application of conductor paste in another, area. One mask may delineate the conductor patterns for one layer of metal strips used in the coupler array, and other masks may delineate the conductor patterns for other layers of metal strips used in the conductor array. Still other masks may locate the position of conducting vias to bring electrical contacts from the layer containing the conductive strips to the surface layer for coupling with test equipment. These masks may be rigidly supported by surrounding frames containing holes and pins to facilitate the critical alignments necessary in the manufacturing process. The critical dimensions of line width and spacing used on these masks may be predistorted by carefully controlled amounts to allow for the shrinkage expected in the firing process. This amount of shrinkage is dependent upon the materials used, the layer thickness, the firing temperatures, the overall size of the package, and other factors, as is known to one of skill in the art.

The manufacture of a multilayer ceramic package may begin with the preparation of the dry ceramic material to ensure a uniform consistency without contaminants, using a Ball Mill, as is known in the art. Upon addition of liquid constituents, optionally in a precisely controlled fashion, a layer of ceramic tape is cast. Once the tape is cast to the proper thickness, a "blank" may be cut from it appropriate to the size of assembly contemplated. Precisely located holes may be punched in the blank where conducting vias are eventually to be placed, and conducting pastes may be screened on in appropriate locations using the masks described in the preceding paragraph. This process may be repeated for as many layers as required to create a multilayer assembly, termed lamination. All these processes may be carried out in such a way, and with special tools, so as to ensure the proper alignment of buried conductor layers in the finished product.

The laminated assembly may then be baked at a high temperature, optionally in a controlled atmosphere, to remove the liquid constituents from the finished product and provide a rugged hermetic package. After the firing stage, further steps involving plating, marking and cutting separate parts from a multipart assembly, termed singulation, may be performed. The coupler arrays may be measured prior to singulation to provide evidence of proper layer alignment.

These techniques are widely used throughout the printed circuit board manufacturing industry, are known to those of skill in the art, and are described in more detail in "The Multilayer Printed Circuit Handbook", by J. A. Scarlett, 1985, ISBN#0-901150-15-0 and Steven E. Annas, "Advances in LTCC for Flip Chip and Chip Scale Packaging" *Chip Scale Packaging*, January, 1999. U.S. Pat. No. 5,351,001 discusses a number of techniques for the fabrication of multilayer devices which may be applied to the systems and methods described herein.

While the invention has been disclosed in connection with the embodiments shown and described in detail, various equivalents, modifications, and improvements will be apparent to one of ordinary skill in the art from the above description. Such equivalents, modifications, and improvements are intended to be encompassed by the following claims.

What is claimed is:

1. A pair of coupling strips for detecting layer misalignment in a multilayer device, comprising
   a lower coupling strip formed on a first layer of said multilayer device, and
   an upper coupling strip formed on a second layer of said multilayer device, the second layer disposed on the first layer so as to be disposed between the lower coupling strip and the upper coupling strip, said upper coupling strip disposed parallel to and offset from the lower coupling strip by a predetermined amount, wherein measuring the amount of coupling in the pair of coupling strips is useful for detection of layer misalignment in the multilayer device.

2. A coupler array in a multilayer device for detecting layer misalignment in the multilayer device, comprising
   at least two first pairs of coupling strips, wherein each first pair comprises
   a lower coupling strip formed on a first layer of said multilayer device, and
   an upper coupling strip formed on a second layer of said multilayer device, the second layer being disposed on the first layer so as to be disposed between the lower coupling strip and the upper coupling strip, the upper coupling strip disposed parallel to and offset from the lower coupling strip by a predetermined amount,
   wherein the offset amounts of at least two pairs of coupling strips are different, whereby measuring the amount of coupling in different pairs of coupling strips is useful for detection of layer misalignment in the multilayer device.

3. The coupler array of claim 2, wherein at least one pair of coupling strips has an offset amount of zero.

4. The coupler array of claim 2, wherein the offset amounts of at least two pairs of coupling strips differ by a predetermined amount.

5. The coupler array of claim 2, further comprising
   at least two second pairs of coupling strips disposed in parallel, wherein the offset amounts of at least two second pairs of coupling strips are different, and the second pairs of coupling strips are not parallel to the first pairs of coupling strips.

6. The coupler array of claim 5, wherein measuring the amount of coupling in first pairs of coupling strips and in second pairs of coupling strips is useful for determining layer misalignment in two dimensions.

7. The coupler array of claim 2, further comprising
   at least two second pairs of coupling strips disposed in parallel, wherein the offset amounts of at least two second pairs of coupling strips differ, and wherein the upper coupling strips of said second pairs of coupling strips are disposed on a third layer of said multilayer device, and the lower coupling strips of said second pairs of coupling strips are disposed on the second layer of said multilayer device, the third layer being disposed on the second layer so as to be disposed between the lower coupling strips and the upper coupling strips of said second pairs of coupling strips.

8. A method for detecting misalignment of layers in a multilayer device, comprising providing a device including a coupler array of claim 2, measuring amounts of coupling in at least two pairs of coupling strips, comparing the amounts of coupling measured in different pairs of coupling strips, and determining the relative alignment of the first layer with the second layer.

9. A system for measuring misalignment of layers in a multilayer device, comprising a coupler array of claim 2, a microwave generator coupled to at least one pair of coupling strips, and a microwave receiver to measure the amount of coupling in the at least one pair of coupling strips.

10. A method for measuring misalignment of layers in a multilayer device, comprising the acts of providing a coupler array according to claim 2, providing a microwave generator, coupling said generator to a first pair of coupling strips, measuring the amount of coupling in the first pair of coupling strips, coupling said generator to a second pair of coupling strips, measuring the amount of coupling in the second pair of coupling strips, comparing the amount of coupling in the first pair of coupling strips to the amount of coupling in the second pair of coupling strips, and determining the misalignment of layers in the multilayer device.

11. A method for manufacturing a pair of coupling strips for detecting layer misalignment in a multilayer device, comprising the acts of providing a first layer of said multilayer device, forming a lower coupling strip on the first layer of said multilayer device, disposing a second layer of said multilayer device above said lower coupling strip, and forming an upper coupling strip on the second layer of said multilayer device, said upper coupling strip being separated a distance apart from the lower coupling strip, disposed parallel to the lower coupling strip and offset from the lower coupling strip by an offset amount.

12. A method for manufacturing a coupler array for detecting layer misalignment, comprising the acts of providing a first layer of said multilayer device, forming at least two lower coupling strips on the first layer of said multilayer device, disposing a second layer of said multilayer device above said lower coupling strips, and disposing at least two corresponding upper coupling strips on the second layer of said multilayer device, wherein lower coupling strips and corresponding upper coupling strips form pairs of coupling strips, wherein, for each pair of coupling strips, said upper coupling strip is disposed parallel to said lower coupling strip and offset from the lower coupling strip by an offset amount whereby at least two pairs of coupling strips have different offset amounts.

13. The method of claim 12, wherein the act of disposing includes disposing at least one pair of coupling strips having an offset amount of zero.

14. The method of claim 12, wherein the act of disposing includes disposing at least two pairs of coupling strips having predetermined offset amounts.

15. A method for detecting misalignment of layers in a multilayer device, comprising providing a device having a first layer including at least two first reference probes disposed parallel to each other and spaced by a predetermined amount and a second layer including at least two second reference probes disposed parallel to each other, spaced by a different predetermined amount, the second layer disposed on the first layer so as to be disposed between the first reference probes and the second reference probes, measuring an amount of coupling between at least two said first reference probes and corresponding second reference probes, comparing the amounts of coupling measured for different reference probes, and determining the misalignment of the first layer with the second layer.

* * * * *